Figure 1:
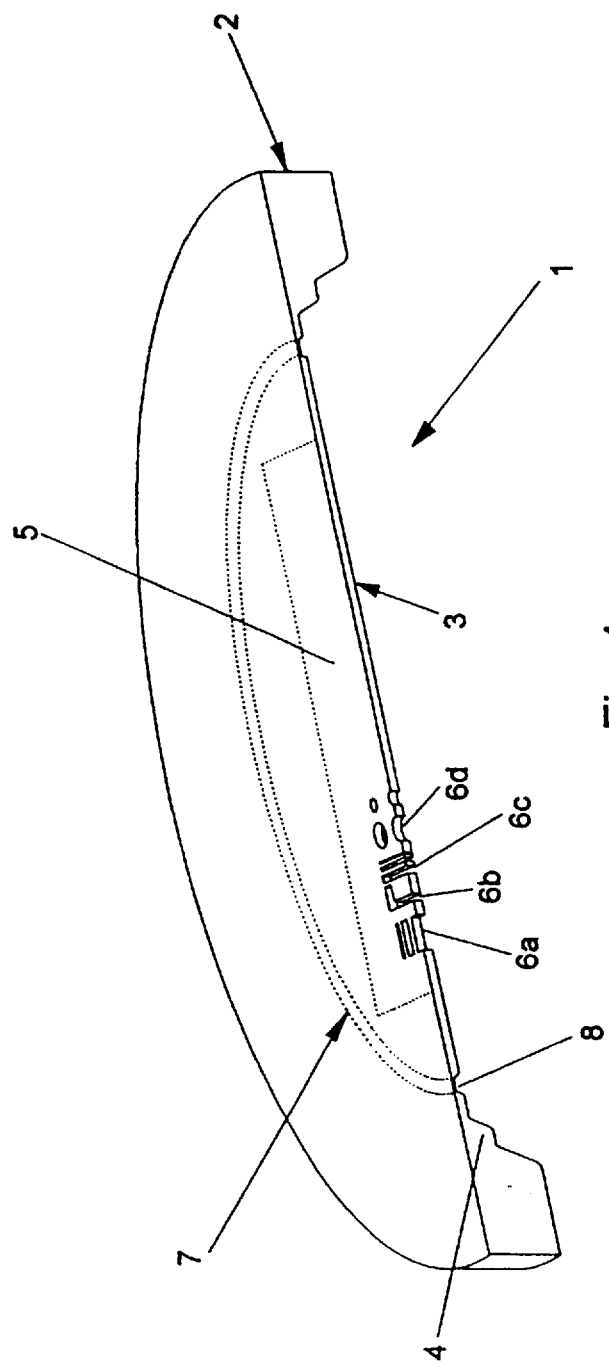

United States Patent
Vonach et al.

[19]

[11] Patent Number: 5,876,880
[45] Date of Patent: Mar. 2, 1999

[54] PROCESS FOR PRODUCING A STRUCTURED MASK

[75] Inventors: Herbert Vonach, Klosterneuburg; Alfred Chalupka; Hans Löschner, both of Vienna, all of Austria

[73] Assignee: IMS Ionen Mikrofabrikations Systeme Gellschaft M.B.H., Vienna, Austria

[21] Appl. No.: 930,065

[22] PCT Filed: May 30, 1995

[86] PCT No.: PCT/AT95/00111

§ 371 Date: Nov. 25, 1997

§ 102(e) Date: Nov. 25, 1997

[87] PCT Pub. No.: WO96/38763

PCT Pub. Date: Dec. 5, 1996

[51] Int. Cl.⁶ ........................................... G03F 9/00
[52] U.S. Cl. .................................. 430/5; 430/308
[58] Field of Search ........................ 430/5, 308, 327, 430/324; 250/492.2; 204/33.2

[56] References Cited

U.S. PATENT DOCUMENTS

| | | | |
|---|---|---|---|
| 4,780,382 | 10/1988 | Stengl et al. | 430/5 |
| 4,827,138 | 5/1989 | Randall | 250/492.2 |
| 4,855,197 | 8/1989 | Zapka et al. | 430/5 |
| 4,966,663 | 10/1990 | Mauger | 204/33.2 |
| 4,985,634 | 1/1991 | Stengl et al. | 250/492.2 |
| 5,110,373 | 5/1992 | Mauger | 148/33.2 |

FOREIGN PATENT DOCUMENTS

| | | | |
|---|---|---|---|
| 0244496 | 6/1986 | European Pat. Off. | G03F 1/00 |
| 0330330 | 2/1989 | European Pat. Off. | G03F 1/00 |
| 0367750 | 9/1989 | European Pat. Off. | H01L 21/306 |
| 383438 | 12/1981 | Germany | H01L 21/32 |

OTHER PUBLICATIONS

J. Olschimke, et al., "Periodic Si–HOLE–Maska in the $\mu$m AND sub–$\mu$m RANGE for Electron–Multibeamwriting," Microelectronic Engineering 5 (1986), pp. 405–412.

Waggener, "Electrochemically Controlled Thinning of Silicon," B.S.T.J. Brief, Mar. 1970, pp. 473–475.

Keyser, J. et al., "Pattern Distortions in EBP Stencil Masks," Microelectronic Engineering, 11 (1990), pp. 363–366.

Black, et al., "Studies of Boron and Boron–Germanium doped Epitaxial Silicon Films for Silicon Diaphrams," Extended Abstracts, vol. 82–1, (1982) Abstract No. 122.

Liddle, J. Alexander, et al., "Stress–Induced Pattern–Placement Errors in Thin Membrane Masks," J. Vac. Sci. Technol. B 12 (6), Nov/Dec 1994, pp. 3528–3532.

Mauger, P.E., et al., "Silicon Stencil Masks for Lithography Below 0.25 $\mu$m by Ion–Projection Exposure," J. Vac. Sci. Technol. B 10(6), Nov/Dec 1992, pp. 2819–2823.

*Primary Examiner*—S. Rosasco
*Attorney, Agent, or Firm*—Finnegan, Henderson, Farabow, Garrett & Dunner, L.L.P.

[57] ABSTRACT

A process is disclosed for producing a structured mask for use in reproducing structures of that mask on an object with the aid of electromagnetic or particulate radiation, in particular for ion beam lithography. A flat smooth substrate of more than 20 $\mu$m in thickness is selected and a thin diaphragm is produced from that substrate by etching one of the sections removed from the edging to a depth of c. 0.5–20 $\mu$m, the tensile stress within the diaphragm being greater than 5 MPa. Lithographic structures are then formed on a central region of the diaphragm with a tensile stress of more than 5 MPa; apertures are etched into the diaphragm to form the mask structures and the effective thickness inside a diaphragm region substantially enclosing the mask structures is reduced, causing the central region containing the structures to be joined to the substrate edging elastically in such a way that the mean tensile stress within this central region is reduced to below 5 MPa. The region with reduced effective thickness preferably takes the form of a peripheral channel or at least one perforation.

29 Claims, 5 Drawing Sheets

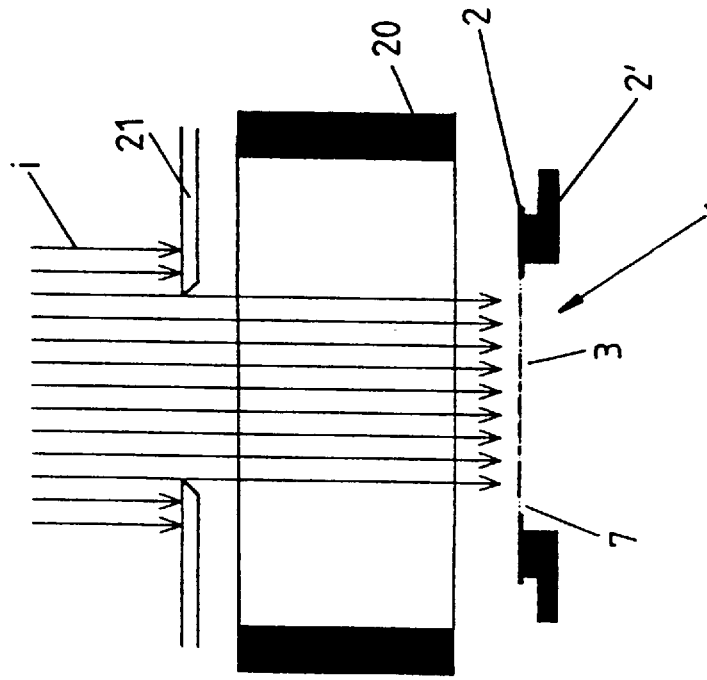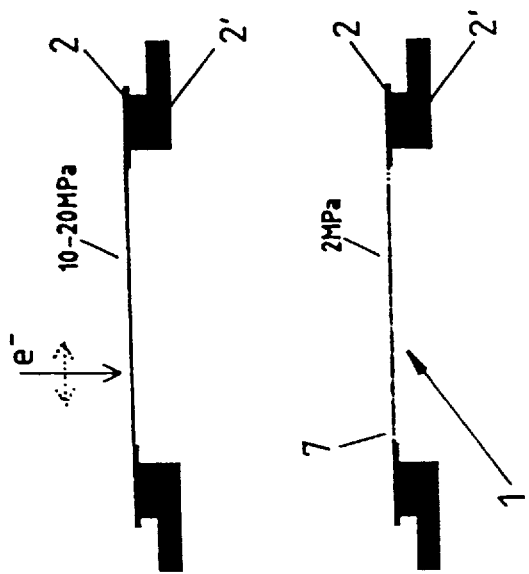

PROCESS FOR PRODUCING A STRUCTURED MASK

The present invention relates to a method for producing a structured mask for the purpose of imaging structures of this mask onto an object by means of electromagnetic radiation or particle radiation, especially for use in ion beam lithography.

Masks for use in lithography are large surface-area, generally disc shaped structures consisting of a membrane of a thickness ranging from approx. 1 $\mu$m to 20 $\mu$m which are held by an outer frame encompassing the membrane. In the case of so-called stencil masks, holes are created in the membrane within a central mask design field and these holes form the structures of the mask. Upon radiating a stencil mask with electromagnetic radiation or particle radiation the beams pass unhindered through the holes of the membrane, whereas the beams are absorbed in all other regions of the membrane.

Such masks are mainly produced by etch thinning a substrate, e.g. a silicon wafer, by means of a suitable etch-stop method, to the desired thickness, wherein an outer edge remains untreated, so that a portative solid edge is formed, by means of which solid edge the mask can later be clamped into a frame. The structures of mask are applied lithographically, e.g. by means of electron beam lithography, onto the upper side of the membrane and holes are produced in the membrane by means of etching.

It follows from this, that in order to produce a stencil mask a series of processing steps are necessary in which the membrane is subjected to a mechanical loading. It is therefore necessary that the membrane is under a certain amount of tensile stress. Such tensile stress can be stress which is caused by a thermic reaction or even stress caused by the doping process. Tensile stress caused by doping occurs if the substrate or the membrane is doped with a doping substance whose atom diameter is less than that of the substrate atoms, e.g. if silicon is doped with boron or phosphorus. This type of doping procedure is necessary in many cases in order to create an effective (electrochemical or wet-chemical) etching stop for the thin etching of the substrate since a membrane of uniform thickness can be produced in this manner. Methods of thinning silicon substrates by means of etching are described in detail inter alia in Extended Abstracts, vol 82-1 (1992) in abstract no. 122 entitled "Studies of Boron and Boron-Germanium doped Epitaxial Silicon Films for Ultrathin Silicon Diaphragms" (Black et. al). and in The Bell System Technical Journal, March 1970 on pages 473 ff entitled "Electrochemically Controlled Thinning of Silicon".

A method for producing a thin membrane for use as a stencil mask is also evident from EP-A-367 750 held by the applicant. In the case of the method disclosed therein, the resulting stress in the mask is taken into consideration at the time of manufacturing the membrane, in that for the process of doping the substrate in order to produce an etching stop a predetermined doping material is used in a predetermined doping concentration. In dependence upon the density of holes the localized stress in the structured mask is changed with respect to the stress in the membrane. The density of holes in conventional masks ranges from a few percent to approx. 50%.

All masks produced in the manner described above thus comprise owing to the manufacturing process a certain amount of tensile stress which causes the holes in the stencil mask to be offset with respect to their desired position. As a result, displacements can be great if one area with a high density of holes is immediately adjacent to an area with a low density of holes. Furthermore, the deviation of the structures from the desired position generally increases towards the outside. For these reasons efforts have been made for some time to reduce the stress in the membranes manufactured in this manner to a lowest possible value in order to minimize the displacements of the structures. More precise tests regarding distortions of masks can be found inter alia under the title "Pattern Distortions in EBP Stencil Masks" (Keyser and Kulcke), published in Microelectronic Engineering, 11 (1990) 363–366 and the publication entitled "Stress Induced Pattern-Placement Errors in Thin Membrane Masks" (Liddle and Volkert, AT&T Bell Laboratories), J. Vac. Sci. Technol. B 12(6), Nov/Dec 1994, 3528 ff. It is maintained in the latter article that it is not possible using stencil masks to maintain the predetermined error tolerances in the case of a layout in the sub–0.25 $\mu$m range.

It has become apparent that it is technologically difficult at the moment to reduce the stress in the original membrane to a value below 10 MPa in order to produce the mask, since otherwise the membrane is unable to withstand the mechanical loads of the mask manufacturing process, e.g. spinning photoresists. Thus, conventional manufacturing methods at present produce a lower limit for the stress which results in a certain amount of displacements of the mask structures which are unacceptable for electronic circuits of particularly small dimensions. A method for producing such a mask according to the prior art (10 MPa stress) is for example described in detail in J.Vac. Sci. Technol B 10(6), Nov/Dec 1992, 2819 ff under the title "Silicon Stencil Masks for Lithography below 0.25 $\mu$m by Ion-Projection Exposure".

U.S. Pat. No. 780,382 held by the applicant discloses one possible solution wherein the entire mask design field is provided with a supporting grating structure so that the structures of the mask can be held by this grating and cannot be displaced in their position. Furthermore, it is proposed to adapt the thickness of the grating structure to suit the local hole density so that a constant effective thickness is created within the entire mask design field. EP-A-330 330 (=U.S. Pat. No. 4,827,138) proposes as a solution to the above mentioned problem to produce the entire mask as an extremely fine grating structure made from a carrier material in which predetermined holes are filled with a different material in order to produce the opaque regions of the mask. A disadvantage of these solutions resides inter alia in the fact that the carrier structure imposes undesired limitations on the layout design of the electric circuit and considerably more procedural steps are involved in the manufacture of such masks. Furthermore, when using these masks for lithography purposes the grating structures are also imaged onto the substrate in a disadvantageous manner. This condition must be remedied as the image becomes defocussed or the beam path becomes tilted and both lead to an increase in the line width and thus to a reduction in the resolution.

In an as yet unpublished Austrian Patent Application held by the applicant under the file reference A1585/94 it is proposed to solve the above mentioned problem of tensile stress causing displacements of mask structures to vary the thickness and/or the doping concentration in dependence upon the local hole density of the mask in such a manner that a homogeneous average stress is created within the mask design field after production of the masks. For example, areas which have a high hole density are formed slightly thicker than areas with low hole density in order to obtain a substantially homogenous effective thickness. Likewise, it is also possible to achieve a homogeneous average stress with a constant thickness by the fact that areas with high hole density are doped to a greater extent that areas with a low hole density. Also, in order to produce such a mask it is, however, necessary to achieve a predetermined minimum stress value in order to avoid the mask being destroyed during the manufacturing process. There exists between the mask design field, which is generally square or rectangular, and the edge of the membrane, which is generally circular, crescent-shaped membrane segments whose tensile stress is unchanged, e.g. amounts to 10 MPa, whereas in the middle of the mask design field the average tensile stress is reduced depending upon the material reduction to a somewhat lower value owing to the holes. As a consequence, stress is exerted on the mask design field which results in a displacement of the mask structures in the direction of this edge.

A disclosure different to attempting to minimize the stress within the mask is evident in AT-PS 383 438, which describes the manufacture of a mask wherein an inner sheeting, which contains the mask design field, is connected to a reinforcing ring whose thermal coefficient of expansion is greater than that of the mask material, so that during operation at higher temperatures the mask is maintained stressed by virtue of the differing coefficients of expansion. However, this is associated with considerable distortions which nowadays are no longer acceptable. In order that the stressing procedure of the inner sheeting by means of the reinforcing ring is not impaired by the stiff edge of the mask, a thin outer sheeting is likewise provided outside the reinforcing ring, serpentine-like webs are etched into the said outer sheeting and absorb the expansion of the ring and the inner sheeting.

It is the object of the invention to improve the process of manufacturing a structured mask in such a manner that the resulting mask is obtained with particularly low stress, that its distortion is negligibly low and thus that there are no negative effects on the image. One possible solution to this problem would be to develop new manufacturing technology, e.g. new etching methods, which during the manufacturing process cause a slight mechanical loading of the mask. However, this is encumbered with relatively high costs which cannot be justified for cost reasons for such a manufacturing process. The aforementioned object should therefore, if possible, be achieved using established manufacturing technology in order to guarantee a reliable and economic process of manufacturing masks.

This object is achieved on the one hand by means of a method for producing a structured mask for the imaging of structures of this mask onto an object by means of electromagnetic radiation or particle radiation, in particular for ion beam lithography, which comprises the following steps:

a) Select a two-dimensional, planar substrate of a thickness greater than 20 $\mu$m, b) Produce a thin membrane by etching a portion of the substrate remote from the edge to a thickness of approx. 0.5 to 20 $\mu$m, wherein the tensile stress within the membrane is greater than 5 MPa, c) Form the structures using lithography onto a central portion of the membrane at a tensile stress of greater than 5 MPa, d) Etch holes in the membrane which form the structures of the mask, e) Reduce the effective thickness within an area of the membrane substantially encompassing the structures of the mask, so that central portion containing the structures is coupled in a resilient-elastic manner to the edge of the substrate in such a manner that the average tensile stress is reduced within this central portion to a value below 5 MPa.

In the case of this method it has proven itself to be particularly advantageous if the steps d) and e) are carried out simultaneously and upon performing step c) simultaneously with the structures of the mask structures of the area having reduced effective thickness are also provided in the membrane.

As an alternative thereto the said object is also achieved by means of a method for the aforementioned type which comprises the following steps:

a') Select a two-dimensional, planar substrate of a thickness greater than 20 $\mu$m, b') Form the structures of the mask using lithography on an upper side of the substrate wherein the tensile stress is greater than 5 MPa at least within a layer adjacent to the upper side and provided for producing a membrane, c') Etch depressions into the upper side of the substrate to a depth of 0.5 to 20 $\mu$m which form the structures of the mask, d') Reduce the effective thickness within an area, on the upper side of the substrate, substantially encompassing the structures of the mask.

e') Produce a thin membrane by etching a portion of the substrate, remote from the edge, on its lower side to a thickness of approx. 0.5 to 20 $\mu$m, after which the central portion of the membrane containing the structures of the mask is connected by way of the area having reduced effective thickness in a resilient-elastic manner to the edge of the substrate and the average tensile stress of the mask within the area having reduced effective thickness is reduced to a value below 5 MPa.

It has also proven to be particularly advantageous in this method if the steps c') and d') are performed simultaneously and that upon performing the step b') simultaneously with the structures of the mask structures of the area having reduced effective thickness are also provided in the substrate.

All the above mentioned methods and their preferred embodiments have in common that outside the mask design field, i.e. in the area between the structures of the mask and the rigid edge of the membrane a closed area is provided in which the effective thickness is reduced to the extent that this functions in a resilient-elastic manner, so that the area having the structures is virtually decoupled in a resilient-elastic manner from the edge. As a consequence, the average tensile stress within the mask design field can be reduced to a predetermined value below 5 MPa. Since in the case of the methods in accordance with the invention the effective thickness is only reduced after the lithographic forming of the mask structures, it is possible to use, for forming the mask structures, all hitherto applied and established manufacturing techniques for which a sufficiently prestressed membrane (having a tensile stress of more than 5 MPa, in a normal case approx. 10 MPa) is required. In the case of a mask produced in accordance with the invention only extremely slight distortions now occur. Distortions, which are of a linear character, i.e. displacements of mask structures, which increase in a linear manner outwards, can furthermore be compensated by a corresponding adjustment to the magnification. More details regarding this are evident inter alia from the U.S. patent U.S. Pat. No. 4,985,634 held by the applicant. This correction method can be applied both in the case of projection optics (IPL, Ion Projection Lithography) and also in the case of a shadow-casting installation (MIBL, Masked Ion Beam Lithography). In other words, when manufacturing and using the mask in the proper manner there remains only extremely slight non-linear distortions or displacements, which in any case, in contrast to the publication mentioned in the introduction "Stress Induced Pattern-Placement Errors . . ." can guarantee the use of such masks in the 0.1 μm range.

The area having reduced effective thickness can be produced within the scope of the present invention in different ways. On the one hand, this area can be produced by etching the membrane in the region of this area to a reduced thickness, e.g. in the form of a circumferential groove. Likewise, the area having reduced effective thickness can be produced by etching holes into the membrane within this area.

The effective thickness within this area preferably amounts to between 1 and 40% of the thickness of the unstructured membrane. Good results can be achieved with areas whose effective thickness is reduced within the area to a value below 20%.

The subject matter of the present invention is furthermore a projection mask which is produced by means of one of the two above mentioned methods. In the case of such a mask the area having reduced effective thickness is formed advantageously as at least one perforation encircling the structured region. In the event that two or more perforations are provided, it is of advantage that these are disposed substantially parallel or concentric and the perforation slots are disposed offset with respect to each other in the tangential direction, rendering possible a bending load on the portion lying between them. Owing to the fact that in the case of this embodiment a bending load also occurs in addition to the tensile load, the resilient-elastic effect of this area increases considerably and it is therefore possible even in the case of a substantially smaller reduction in the effective thickness to achieve a sufficient reduction in the tensile stress within the mask design field.

In the case of a preferred exemplified embodiment the area comprises holes which are disposed in a row and between said holes the structured region of the mask and the edge of the membrane are mutually connected in each case by way of a web. If the webs are formed radially, then although they are subjected only to a tensile load, the said webs are to be produced simply in corresponding dimensions. If the webs comprise not only radial but also tangential portions, then the case of a mixture of load (tensile and bending load) occurs so that a particularly strong resilient-elastic effect of the area can be expected.

Further advantages and features of the manufacturing process in accordance with the invention are evident from the description hereinunder of concrete exemplified embodiments, wherein reference is made to the attached figures, in which:

FIG. 1 shows a non-scale, schematic illustration of a mask having a circumferential groove which was produced according to the method in accordance with the invention.

Figure 1A:
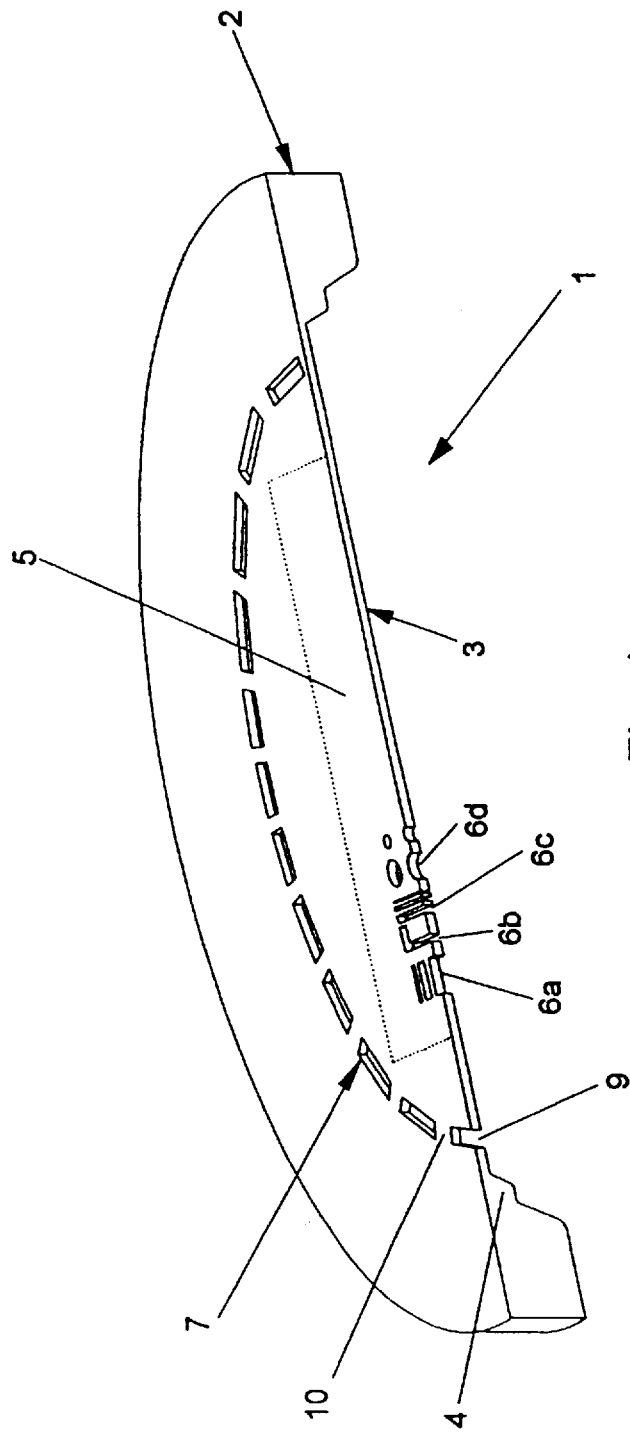
Figure 2:
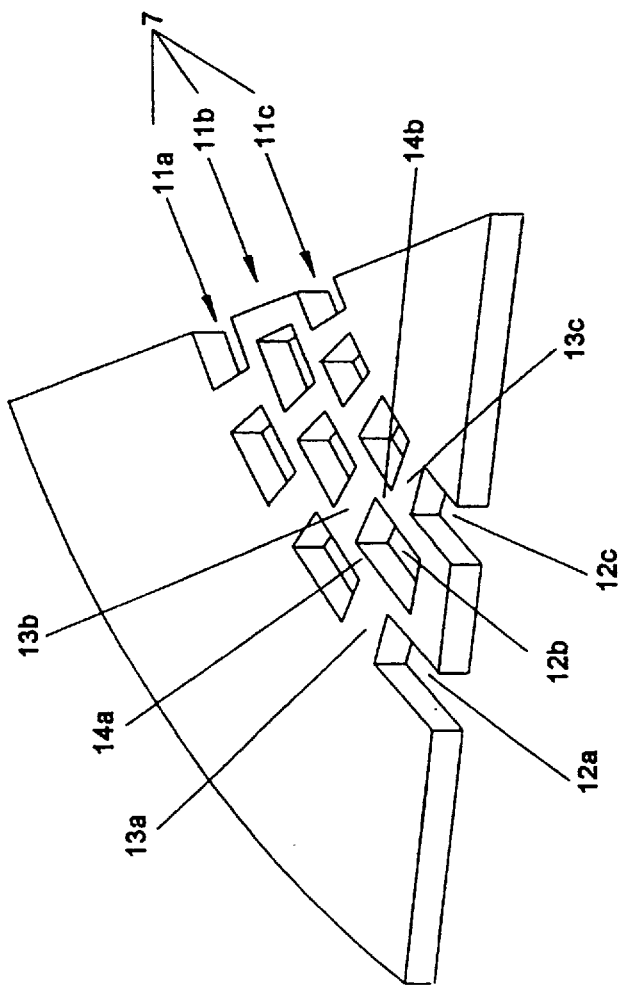
Figure 3:
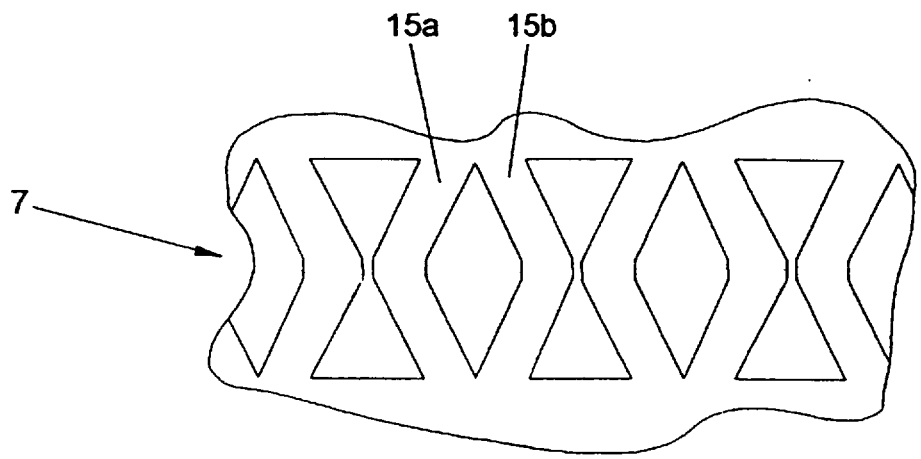
Figure 4:
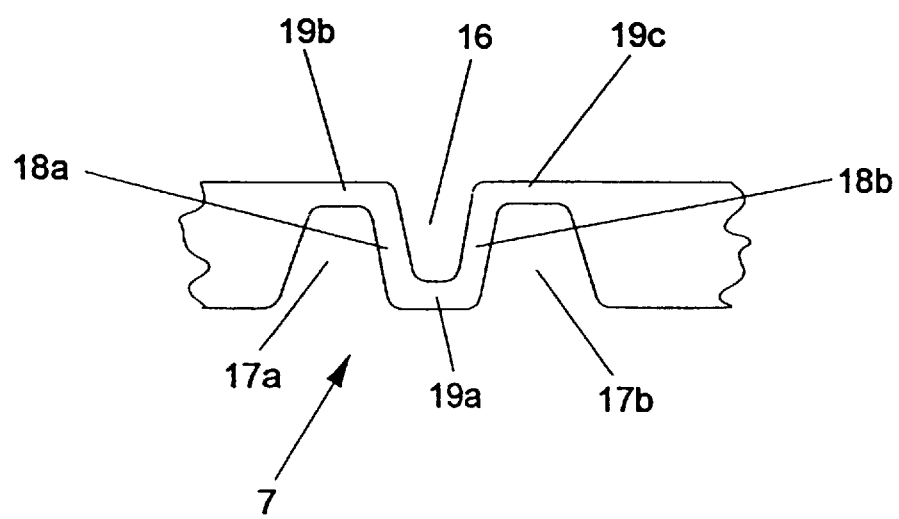

FIG. 1a shows one embodiment of the mask as shown in FIG. 1 having a circumferential perforation ring, FIG. 2 shows a mask of the type in accordance with the invention having three concentric perforation rings, FIG. 3 shows a detailed sectioned plan view of a mask in which the area having the reduced effective thickness is illustrated in the form of webs and holes, FIG. 4 shows a detailed sectioned cross-section of a mask in which the area having the reduced effective thickness is illustrated in the form of three concentric grooves, FIGS. 5a, 5b and 5c show steps of the manufacturing method and the subsequent use of the mask, wherein FIG. 5a shows the lithographic step of the manufacturing method, FIG. 5b shows the mask after completion of the manufacturing method and FIG. 5c shows the mask being used for ion beam lithography.

Firstly, the essential steps of the method will again be discussed with reference to a concrete exemplified embodiment, wherein reference is made to FIGS. 5a, 5b and 5c in order to explain the manufacture of a large surface-area silicon mask for use in ion beam lithography.

The first step of the method is to select a suitable substrate, e.g. a commercially available silicon wafer (n- or p-type). In order to be able to perform an electrochemical etching stop method, it is necessary to produce a pn- or np-transition on the desired membrane thickness for the mask by doping the silicon wafer. In so doing care must be taken that the atoms of the doping substance have a smaller diameter than the silicon atoms (<1.10 Angstrom) in order to produce a tensile stress in the membrane. For a silicon wafer it is preferable to use for this purpose boron or phosphorous, namely boron as the p-dopant of an n-type wafer and phosphorus as an n-dopant for a p-type wafer. The wafer is preferably doped using ion implantation, wherein the dose and the energy are such that the pn-transition responsible for the etching stop is formed in a depth of 2–3 μm and the dopant concentration produces a tensile stress of approx. 10 MPa, as such a membrane can be further processed comfortably. This stress is, however, adapted in the individual case to suit the requirements of the subsequent method steps and can therefore also lie above or below this value.

The mathematical relationship between dose and resulting stress is explained in detail in EP-A-367 750 held by the applicant, so that the dopant concentration necessary for a stress of 10 MPa can be determined precisely in advance. As mentioned above an electrochemical etching stop method is used for etch thinning the wafer, which method is described in detail in the publication, mentioned in the introduction, in The Bell System Technical Journal, March 1970 on pages 473 ff under the title "Electrochemically Controlled Thinning of Silicon" and is not explained in detail here.

In the event that the method, likewise already mentioned above, in accordance with the Austrian Patent Applicant A1585/94 held by the applicant is used, then the dose and/or the depth of the dopant of the wafer substrate must be varied locally accordingly within the mask design field. This occurs by means of a two- or multiple-stage doping process, wherein prior to each step a predetermined structuring of the wafer surface is achieved by lithography. This method can be used without any problem for masks of the type in accordance with the invention, it is, however, not absolutely necessary. The content with respect to the masks of the said A1585/94 is in any case specifically to be regarded as part of the current disclosure.

Upon termination of the etch thinning the wafer substantially has the appearance as illustrated in FIG. 5a. Its thickness on its outer edge 2 remains unchanged, whereas the entire region 3 within this edge is etched to a predetermined thickness, i.e. approx. 2–3 μm. Based on the fact that the tensile stress during the production of the masks can rise readily to a higher value, e.g. 20 MPa, it is possible to hold considerably thinner masks stable during the processing, so that the thickness can be reduced, for example, to 1 μm.

The next step is the lithographic structuring of the membrane surface in order to provide the structures in the mask. For this purpose, the etched thin wafer is first provided with a thin oxide layer. In order not to change the stress characteristics of the membrane considerably, the oxide layer should be as homogenous and as thin as possible. Particularly good oxide layers can be produced, for example, by LPCVD (Low Pressure Chemical Vapour Deposition). Furthermore, the oxide layer can be treated in a subsequent step with nitrogen at a predetermined temperature in order to reduce the tensile stress of this oxide layer precisely to the value for the silicon membrane, e.g. 10 MPa. In the event that the production process of the mask is drawn out over a longer period of time, it is recommended to store the wafer in a nitrogen atmosphere in order to hold the stress precisely at the predetermined value.

Generally, the wafer is clamped at this point in time into a frame 2' in order for the subsequent lithography process to be more easily manageable. Owing to the thermal coefficients of expansion this frame is normally produced from the same material as the membrane, i.e. in the present case from silicon. In the case of silicon wafers Pyrex rings can also be used if necessary. FIG. 5a shows the mask in this state.

The subsequent lithographic structuring of the membrane upper side is performed in a known manner by applying a suitable photoresist material in a layer which is free of stress and as thin and homogeneous as possible and by subsequently exposing the photoresist layer to an electron beam e" with the aid of a commercially available electron beam plotter, e.g. MEBES III.

In the event that the area, encompassing the mask design field, in which the effective thickness is reduced in accordance with the invention to the extent that a resilient-elastic coupling is produced between the edge and the mask design field, comprises holes which are mutually separated by webs (cf. FIG. 1a, 2 and 3) not only the structures of the mask itself are plotted during the step of electron beam plotting, the structures of this area are also plotted simultaneously.

The exposed resist layer is initially developed, after which the oxide layer on the exposed or non-exposed sites—depending upon whether a positive or negative resist is used—is etched away as far as the membrane surface and the still remaining resist is removed. As the next step, the holes forming the structures of the mask are etched. This procedure is performed in an advantageous manner by means of reactive ion beam etching (RIE, Reactive Ion Etching). The technological parameters for the method steps just described are sufficiently known to the person skilled in the art and are not explained in detail here. In the case of a preferred variant, all steps after the creation of the resist until the etching of the holes can be performed in a single procedural step by means of a multi-step process in a reactive ion beam etching reactor. Precise details regarding an etching reactor suitable for this purpose and its operating conditions can be found inter alia in the publication in J.Vac. Sci. Technol. B 10(6), Nov/Dec 1992 2716 ff under the title "Magnetically enhanced triode etching of large area silicon membranes in a molecular bromine plasma".

In the case of this procedure step, the average stress of the mask now reduces from its starting value, e.g. 10 MPa, upon correctly dimensioning the area to a value below 5 MPa, preferably down to approx. 2 MPa, so that the mask design field of the membrane now does not comprise any disturbing distortions. The stress in the material within the area increases considerably and can be in the order of a value above the tensile stress in the mask design field. However, this does not represent any problems for the subsequent use of the membrane as the breaking point, e.g. of the silicon material, lies in the range of 100 MPa. Even in the case of a reduction in the effective thickness to 1% of the original membrane thickness this critical value is not achieved. In comparison to when producing the mask, no substantial mechanical loads occur when using the mask in a projection or shadow-casting lithography installation, so that there is a great deal of leeway for the dimensioning of the area having reduced effective thickness. A lower limit for the tensile stress within the mask design field of a stencil mask of the type described resides substantially in the fact that owing to its interaction with the electric field of the imaging system the membrane can no longer be held level in one plane. However, calculations have shown that in the case of masks currently used having a mask design field of 100×100 mm this limit lies in the range below 2 MPa of average effective tensile stress. This is evident inter alia from the international application under the file reference PCT/AT/00003 held by the applicant.

After the step of the reactive ion beam etching process the remaining oxide layer must merely be removed, e.g. as usual, by means of oxide stripping using HF. Thus the manufacture of the mask is substantially completed for the event that the area having reduced effective thickness is formed by holes and webs.

If on the other hand, the area having reduced effective thickness is to be produced by reducing the membrane thickness in this area, as illustrated for example in FIGS. 1 and 4, then during the reactive ion beam etching process the structures of the mask are initially only produced within the mask design field. The average tensile stress drops within the mask design field to a lower value, so that the mask structures at this point in time are subjected to a certain amount of displacement. In this case after the reactive ion beam etching process a further lithographic step is performed in order to produce the structures of the area having reduced effective thickness. Since the structures of the area in contrast to the structures of the mask itself do not require high resolution, then this lithographic process can be performed in an optical manner or with a simple shadow mask. During the subsequent process of etching the membrane to a reduced thickness various methods can be used, for example reactive ion bean etching, electrochemical etching with etching stop, wet-chemical etching or sputter etching. In the case of sputter etching by means of a directed ion beam the lithography step can also be omitted as the ion beam can be directed to the area without it. It is likewise possible to limit the etching process by means of a simple shadow mask to the area to be etched. In so doing, the tensile stress within the mask design field is reduced to an average value below 5 MPa, so that the aforementioned displacements of the mask structures can be eliminated again. Naturally, the area of reduced thickness of the membrane can comprise a particularly high distortion and stress. As mentioned above, however, this does not have any influence on the quality of the imaging, since this region is not involved in the imaging process. (cf. FIG. 5c).

It is possible in the case of a further embodiment to combine the two above mentioned method types, i.e. the area of reduced effective thickness can be an etched thin region of the membrane in which holes are also provided which are mutually separated by means of webs.

In the case of an alternative embodiment of the method in accordance with the invention, although the same method steps as explained above are used, the sequence of these method steps is however changed. In the case of this embodiment the structures of the mask are first provided in the relatively thick wafer and etched to a depth which corresponds at least to the thickness of the subsequently produced membrane. If necessary, the structures of the area having reduced effective thickness are also produced at this point in time. The final method step to be performed is then the etching thin of the wafer to the thickness of the membrane, wherein the tensile stress is only reduced to the desired value below 5 MPa upon completion of the etching method, e.g. by means of an electrochemical etching stop method. The area having reduced effective thickness is again responsible for this in the above mentioned manner. The alternative method can, however, also be performed in the manner in which the area having reduced effective thickness is only produced after the etching thin of the membrane. As a consequence, although two lithographic method steps are required, the advantage is however achieved that the membrane during the entire etching thin process and also thereafter comprises the predetermined tensile stress, e.g. 10 MPa, and is thus particularly stable. At the end of the manufacturing method, the mask is substantially of the appearance illustrated in FIG. 5b, wherein the average tensile stress within the mask design field now only amounts to approx. 2 MPa. This mask can now be used without any further processing measures in a lithography installation, of which a detailed sectional view is illustrated schematically in FIG. 5c, where it can be seen that above the mask a so-called cooling cylinder 20 is disposed which is provided for the radiant cooling of the mask, so that this can be held at a constant temperature. Furthermore, an aperture stop 21 is evident in FIG. 5c by means of which the impinging beam i is limited to the mask design field and if necessary adjusting apertures. This aperture stop thus prevents the structures of the area 7, e.g. the perforation, being imaged onto the object lying below. It is evident from FIG. 5c that this mask is equally suitable for use both for projection apparatus e.g. IPL, and also for a shadow-casting device, e.g. MIBL.

It goes without saying that the above described method in accordance with the invention is by no means limited to the use of a silicon mask. Likewise, it is possible in the case of the method in accordance with the invention also to use other materials, for example $SiO_2$, Poly-Si, $Si_3N_4$, SiC or a suitable carbon modification, e.g. a diamond sheeting.

Depending upon the average hole density within the mask design field the reduction in the effective thickness in the area encompassing the mask structures can have the following effect. In the case of a small reduction in the effective thickness, e.g. to 70%, the mask structures can always still be displaced outwards in the direction of the area. In the case of a particularly large reduction in the effective thickness, e.g. to 1%, then the mask structures can be displaced inwards. Thus, between the two values there is a point for the reduction of the effective thickness, at which the structures are neither displaced outwards nor inwards. The average tensile stress is reduced, in dependence upon the average hole density and the starting value of the tensile stress, to a predeterminable value. It is, however, also possible within the scope of the present invention to reduce the average tensile stress to a value lying somewhat below or above this predetermined value, so that the mask structures are displaced by a certain amount with respect to their desired position. The extent of this displacement increases however in a linear manner with the radius and can therefore either be taken into consideration when designing the layout or corrected during the subsequent use of the mask by means of the lens system, in that the device is corresponding enlarged or reduced.

FIG. 1 illustrates schematically an exemplified embodiment for a mask 1 (non-scale) which was produced according to the method in accordance with the invention. This mask 1 produced from a circular wafer substrate comprises a relatively thick edge 2 which is necessary for handling the mask. Within the edge there is located a membrane 3 which was produced by etching thin the wafer substrate. A transition region 4 which is somewhat thicker than the membrane, e.g. twice as thick, is disposed between the membrane 3 and the edge 2. This said transition region prevents the membrane from fracturing owing to the notch effect occurring here.

A mask design field 5, edged by the broken line, is provided in the central region of the membrane and the structures of the mask, illustrated schematically, are formed as holes 6a, 6b, 6c, 6d within said mask design field. In accordance with the invention the mask 1 comprises an area 7, indicated by the broken line, which comprises a reduced effective thickness and which encompasses the mask design field 5. The said area 7 connects the middle of the membrane 3 with the edge 2 in a resilient-elastic manner so that the tensile stress in the middle of the mask design field reduces to an average value of less than 5 MPa and does not cause any unacceptable displacements or distortions of the mask structures. As is evident in FIG. 1, the area 7 in the case of this exemplified embodiment is formed as a circumferential groove 8 which is formed on the lower side of the mask 1 and concentric to the mask design field. However, such a groove can be provided within the scope of the present invention also on the upper side or both on the upper side and also on the lower side.

In the case of the mask illustrated in FIG. 1a which is extremely similar to that of FIG. 1, the area 7 is formed as a row of identical holes 9 disposed on the periphery of a circle. The said holes are separated from each other by a web 10 respectively, wherein the radially extending webs 10 represent the single connection between the edge 2 and the membrane 3, whereby in turn the resilient-elastic effect occurs. This design of the area 7 is designated as a perforation ring. The exemplified embodiments illustrated in FIGS. 1 and 1a have in common that the material remaining in the area 7 is tensile loaded.

In the case of the exemplified embodiment illustrated in FIG. 2, this is a mask I in accordance with the invention of which only a segment-shaped portion is illustrated which demonstrates the area 7. In the case of this exemplified embodiment the area 7 consists of three concentric perforation rings 11a, 11b, 11c having holes 12a, 12b, 12c and radial webs 13a, 13b, 13c, wherein the two webs 13a, 13b and 13b 13c of two adjacent perforations rings 11a, 11b or 11b, 11c are displaced by a predetermined angle, so that these webs 13a, 13b and 13b, 13c are mutually connected in each case by way of a tangential cross-piece 14a, 14b. After forming the holes 12a, 12b, 12c in the area 7, in the case of this exemplified embodiment not only the radial webs 13a, 13b, 13c are under tensile load but a bending stress also builds up in the tangential cross-pieces 14a, 14b by means of which the effective elasticity of the area is substantially increased. As a consequence, in contrast to the exemplified embodiments described above, it is possible in an advantageous manner to achieve sufficient reduction in the tensile stress within the mask design field even when the reduction in the effective thickness is less great. Such an effect can naturally be achieved with all shapes of webs which comprise at least in portions a tangential component. An advantage of the embodiment illustrated in FIG. 2 resides inter alia in the fact that the contact points of the webs 13a, 13c at the outer edge and at the membrane are aligned radially, so that when loading the area no tangential forces occur, which could cause the mask design field to be distorted.

A further exemplified embodiment of this type is illustrated in FIG. 3 which illustrates a plan view of the area 7 having the reduced effective thickness. This area comprises only a single perforation ring, in which however the webs 15a, 15b are formed in an angular shape. The tangential components of these webs in the case of this exemplified embodiment also create a bending stress which guarantees increased elasticity. The greater the angles in the webs 15a, 15b, the more the the bending stress portion increases, until the characteristics of the area 7 are determined with respect to the elasticity mainly by virtue of the bending stress component. In the case of the exemplified embodiment illustrated, in each case two adjacent webs 15a, 15b are formed symmetrically to a radially extending straight line, so that in turn disturbing tangential forces cannot occur.

Based on the simple manufacturing process and the good resilient effect which occurs even in the case of a small reduction in the material, embodiments of the type as illustrated in FIGS. 2 and 3, are to be regarded as preferred embodiments. However, it goes without saying that the invention is not limited thereto.

FIG. 4 illustrates a further exemplified embodiment for an area 7 having reduced effective thickness, wherein based on the exemplified embodiment as shown in FIG. 1 a circumferential groove 16 is provided, which is, however, provided here on the upper side of the membrane. Different to FIG. 1, in the case of the exemplified embodiment as shown in FIG. 4 two further grooves 17a, 17b are provided on the lower side of the membrane and the said further grooves are provided on both sides of the groove 16, so that between the grooves 16 and 17a or 16 and 17b thin vertical walls 18a, 18b are formed which are connected at their lower ends to the bases 19a of the groove 16. At their upper ends the walls 18a, 18b are connected on the one side by way of membrane sections 19b 19c to the mask design field and on the other side to the edge. This structure is also subjected to tensile load (sections 19a, 19b, 19c) and also to bending stress (walls 18a, 18b) when exerting a force, so that a particularly high level of elasticity can be achieved.

A considerable advantage of the device in accordance With the invention in addition to the particularly low tensile stress within the mask design field resides inter alia in the fact that the stress within this field also changes very little owing to the elastic coupling if influenced by external forces, e.g. in the case of non-uniform, thermal loading of the edge or in the case of a mechanical, non-uniform loading of the frame.

The area having reduced effective thickness does not necessarily, as illustrated, have to be circular in shape. Within the scope of the present invention, this area can be of any shape whatsoever, e.g. a square shape. Both the width and also the effective thickness of the area need not be constant, but rather can be adapted to suit the local required elasticity between the edge and the mask design field. It is naturally also possible to form the entire area between the mask design field and the edge as an area having reduced effective thickness.

We claim:

1. A method for producing a structured projection mask for the purpose of imaging structures of this mask onto an object by means of electromagnetic radiation or particle radiation, comprises the following steps:
   a) providing a two-dimensional, planar substrate of a thickness greater than 20 $\mu$m;
   b) producing a thin membrane by etching a portion of the substrate remote from the edge to a thickness of approx. 0.5 to 20 $\mu$m, wherein the tensile stress within the membrane is greater than 5 MPa;
   c) forming mask structures using lithography onto a central portion of the membrane at a tensile stress of greater than 5 MPa;
   d) etching holes in the membrane in accordance with the mask structures; and
   e) reducing the effective thickness within an area of the membrane substantially encompassing the mask structures, so that the central portion containing the structures is coupled in a resilient-elastic manner to the edge of the substrate in such a manner that the average tensile stress within this central portion is reduced to a value below 5 MPa.

2. A method according to claim 1, wherein the average tensile stress within the membrane when performing the steps b) and c) is between 8 and 12 MPa, and wherein after performing the step e) the tensile stress is reduced to approx. 2 MPa.

3. A method according to claim 2, wherein the average tensile stress within the membrane when performing steps b) and c) is about 10 MPa.

4. A method according to any one of claims 1, 2, or 3, wherein the step e) is performed by forming holes.

5. A method according to claim 4, wherein the steps d) and e) are performed simultaneously and, when performing step c), the structures of the area having the reduced effective thickness are provided in the membrane simultaneously while forming the mask structures.

6. A method according to claim 1, wherein the required tensile stress of the substrate is produced by doping at least the layer of the substrate forming the membrane, wherein the dopant atoms comprise a smaller diameter than at least one type of atom of the substrate.

7. A method for producing a structured mask for the purpose of imaging structures of this mask onto an object by means of electromagnetic radiation or particle radiation, especially for use in ion beam lithography, which comprises the following steps:
   a') providing a two-dimensional planar substrate of a thickness greater than 20 $\mu$m;
   b') forming mask structures using lithography on an upper side of the substrate wherein the tensile stress is greater than 5 MPa at least within a layer of the substrate adjacent to the upper side and provided for the purpose of producing a membrane;
   c') etching depressions into the upper side of the substrate to a depth of 0.5 to 20 $\mu$m to form the mask structures;
   d') reducing the effective thickness within an area on the upper side of the substrate substantially encompassing the structures of the mask; and
   e') producing a thin membrane by etching a portion of the substrate, remote from the edge, on its lower side to a thickness of approx. 0.5 to 20 $\mu$m, wherein the mask structures are formed as holes and the central portion of the membrane containing these structures is connected by way of the area having reduced effective thickness in a resilient-elastic manner to the edge of the substrate and the average tensile stress of the mask within the area having reduced effective thickness is reduced to a value below 5 MPa.

8. A method according to claim 7, wherein the tensile stress on the upper side of the substrate after performing steps b') to d') is between 8 and 12 MPa, and that the average tensile stress of the mask within the area having reduced effective thickness is reduced to approx. 2 MPa after performing the step e').

9. A method according to claim 7, wherein the tensile stress on the upper side of the substrate after performing steps b') to d') is about 10 MPa.

10. A method according to any one of claims 7, 8, or 9, wherein step d') is performed by forming one of depressions or holes.

11. A method according to claim 10, wherein steps c') and d') are performed simultaneously and wherein, when performing the step b'), the structures of the area having reduced effective thickness also provided on the substrate simultaneously with the mask structures.

12. A method according to any one of claims 7, 8, or 9, wherein the step d') is performed after the step e').

13. A method according to claim 7, wherein the required tensile stress of the substrate is produced by doping at least the layer of the substrate forming the membrane, wherein the dopant atoms comprise a smaller diameter than at least one type of atom of the substrate.

14. A method according to claim 6 or 13, wherein the substrate comprises a silicon disc doped with one of boron or phosphorous atoms.

15. A method according to claim 14, wherein the membrane is produced by means of an electrochemical etching stop method.

16. A method according to any one of claims 1 or 7, wherein the structuring of the membrane and of the layer of the substrate provided for the membrane is performed by means of electron beam lithography.

17. A method according to any one of claims 1 or 7, wherein the etching of the holes and of the depressions is performed by means of reactive ion etching.

18. A method according to any one of claims 1 or 7, wherein the area having reduced effective thickness is produced by etching the membrane in the region of this area to a reduced thickness.

19. A method according to any one of claims 1 or 7, wherein the area having reduced effective thickness is produced by etching holes in the membrane within this area.

20. A method according to any one of claims 1 or 7, wherein the effective thickness within the area is reduced to a value ranging between 1% and 40% of the effective thickness of the unstructured membrane.

21. A method according to claim 20 wherein the effective thickness within the area is reduced to a value below 20%.

22. A projection mask produced according to the method of claims 1 or 7.

23. A projection mask according to claim 22, wherein the area having reduced effective thickness comprises a groove which encircles the structured portion of the mask.

24. A projection mask according to claim 22, wherein the area having the reduced effective thickness comprises a perforation which encircles the structured region.

25. A projection mask according to claim 22, comprising at least two perforations provided in one of a substantially parallel or concentric manner, wherein the perforations comprise slits disposed offset with respect to each other in the tangential direction, whereby a bending load on the portion lying between them is permitted.

26. A projection mask according to claim 22, wherein the area having a reduced effective thickness comprises holes which are disposed in a row encircling the structures of the mask, between which holes the structured region of the mask and the edge of membrane are mutually connected in each case by means of a web.

27. A projection mask according to claim 26, wherein the webs are formed in a radial manner.

28. A projection mask according to claim 26, wherein the webs comprise both radially and tangentially extending portions.

29. A projection mask produced according to the method of claims 1 or 7, wherein the area comprises an annular area disposed concentric to the outer edge of the mask structures.

* * * * *

UNITED STATES PATENT AND TRADEMARK OFFICE
CERTIFICATE OF CORRECTION

PATENT NO. : 5,876,880
DATED : March 2, 1999
INVENTOR(S) : Herbert Vonach et al.

It is certified that error appears in the above-identified patent and that said Letters Patent is hereby corrected as shown below:

Title page, item [73], please change "Gellschaft" to -- Gesellschaft --

Signed and Sealed this

Seventeenth Day of August, 1999

Attest:

Q. TODD DICKINSON

*Attesting Officer*    *Acting Commissioner of Patents and Trademarks*